United States Patent [19]
Boudewijns et al.

[11] Patent Number: 5,592,126
[45] Date of Patent: Jan. 7, 1997

[54] MULTIPHASE OUTPUT OSCILLATOR

[75] Inventors: Arnoldus J. J. Boudewijns, Eindhoven; Johannes P. M. Van Lammeren, Nijmegen, both of Netherlands

[73] Assignee: U.S. Philips Corporation, New York, N.Y.

[21] Appl. No.: 459,608

[22] Filed: Jun. 2, 1995

Related U.S. Application Data

[63] Continuation of Ser. No. 107,500, Aug. 17, 1993, abandoned.

[30] Foreign Application Priority Data

Aug. 20, 1992 [EP] European Pat. Off. .............. 92202546

[51] Int. Cl.$^6$ ............................... H03B 5/00; H03B 27/00
[52] U.S. Cl. .................. 331/45; 331/2; 331/46; 331/50; 331/55; 331/172; 331/57
[58] Field of Search .................. 331/2, 46, 47, 331/50, 55, 56, 57, DIG. 3, 177, 179, 45, 172; 377/72, 74, 78, 79

[56] References Cited

U.S. PATENT DOCUMENTS

| | | | |
|---|---|---|---|
| 3,480,883 | 11/1969 | Gaunt, Jr. .................... | 331/2 |
| 3,539,938 | 11/1970 | Heimbigner ................ | 331/57 |
| 3,662,277 | 5/1972 | White ........................... | 331/2 |
| 4,105,950 | 8/1978 | Dingwall ...................... | 331/57 |
| 4,879,530 | 11/1989 | Wilhelm et al. ............. | 331/45 |
| 4,884,041 | 11/1989 | Walker ........................ | 331/57 |

FOREIGN PATENT DOCUMENTS 0238874   9/1987   European Pat. Off. ............ 307/269

*Primary Examiner*—Robert Pascal
*Assistant Examiner*—Arnold Kinkead
*Attorney, Agent, or Firm*—Bernard Franzblau

[57] ABSTRACT

In a multiphase output oscillator a number of serially coupled oscillator circuits is organized in a loop. Each particular oscillator circuit is coupled to its serial successor in the loop, to provide adjustment of the phase of an oscillation signal of the successor oscillator circuit dependent upon a difference between the phase of the oscillation signal in the successor and the phase of an oscillation signal in the particular oscillator circuit. None of the oscillator circuits will oscillate freely: as each oscillator will adjust its successor all the way around the loop. Indirectly, each oscillator circuit thus influences all of the other oscillator circuits and ultimately over itself. The multiphase output oscillator as a whole will oscillate in a collective mode of oscillation wherein all oscillator circuits oscillate at the same frequency. Successive oscillator circuits along the loop will oscillate at respective fractions of the full oscillation period delayed from each other. These fractions will add up to an integer multiple of periods. The frequency of oscillation is substantially independent of the fractions and may be nearly the maximum attainable frequency of the individual oscillator circuits.

32 Claims, 7 Drawing Sheets

5,592,126

MULTIPHASE OUTPUT OSCILLATOR

This is a continuation of application Ser. No. 08/107,500, filed Aug. 17, 1993, now abandoned.

BACKGROUND OF THE INVENTION

This invention relates to a multiphase output oscillator, that is, to an oscillator for generating several oscillation signals which are a fraction of a full oscillation period delayed with respect to each other.

An example of an oscillator which generates several oscillation signals is a ring oscillator which contains a cascade of N inverters (N being odd). In operation, the signals at the outputs of the inverters in the ring oscillator will periodically change from high to low and back. The signal at the outputs of successive inverters in the cascade are 180 degrees plus an Nth fraction of a full period of oscillation delayed with respect to each other.

Since N must be odd for the ring oscillator to oscillate, ring oscillators have the disadvantage that they do not directly produce pairs of signals delayed with respect to each other by an even fraction of the period. For example, a ring oscillator does not produce signals which are 90 degrees out of phase. Furthermore, the frequency of oscillation of the oscillator decreases inversely proportional to the number, N, of inverters it contains. The maximum frequency is attained with an oscillator consisting of three inverters. The use of more inverters implies a lower frequency. Therefore, the maximum attainable frequency of a ring oscillator decreases in proportion to the fraction of the full period required as the phase difference.

SUMMARY OF THE INVENTION

Amongst others, it is an object of the invention to provide an oscillator in which the maximum attainable oscillation frequency does not decrease in proportion to the fraction of the full period required as a phase difference.

The invention provides for serially coupled oscillator circuits organized in a loop, each particular oscillator circuit having a coupling to its serial successor in the loop, for providing adjustment of a frequency and/or phase of an oscillation signal of the successor, in dependence on a difference between the phase of the oscillation signal in the successor and a phase of an oscillation signal in the particular circuit. In operation, none of the oscillator circuits will oscillate freely. All the way around the loop each oscillator will adjust the phase of its successor oscillator. Indirectly, each oscillator circuit thus exercises an influence over all other oscillator circuits, and ultimately over itself. The multiphase output oscillator as a whole will oscillate in a collective mode of oscillation wherein all oscillator circuits oscillate at the same frequency. Successive oscillator circuits along the loop with oscillate at respective fractions of the full oscillation period delayed from each other. These fractions will add up to an integer multiple of periods, preferably to one period. The frequency of oscillation is substantially independent of the fractions, and may be nearly the maximum attainable frequency of the individual oscillator circuits.

In an embodiment of the oscillator according to the invention, all oscillator circuits in the loop are substantially identical to each other and all couplings are substantially identical to each other. In this way the loop is symmetric, in the sense that seen relative to one oscillator circuit, the appearance of the oscillator is the same as seen relative to any other oscillator circuit. In operation, as a consequence of this symmetry, if there are M oscillator circuits, the successive oscillator circuits will oscillate at the same Mth fraction (1/M) of the full period delayed from each other. The fraction 1/M may be selected arbitrarily by selecting an appropriate number M of oscillator circuits. To achieve this, the oscillator circuits and couplings must be substantially identical to each other in the sense that they have the same structure and contain components which have substantially the same physical parameters. The relative tolerances in the parameters must correspond to the maximum tolerable phase errors.

In an embodiment of the oscillator according to the invention each oscillator circuit comprises a ring oscillator comprising cascaded inverters, each coupling comprising a logic gate having an input coupled to a tap point in said ring oscillator and an output connected to an output of a particular one of the inverters in the ring oscillator in the successor. In this way it is possible to realize a multiphase output oscillator as part of a digital circuit. The output to output connection of the logic gate and the inverter enables the logic gate to adjust the phase of oscillation of the successor dependent upon the phase difference between the particular oscillator and its successor. Of course, the inverters themselves may be implemented by means of circuits capable of realizing more complicated logic functions, such as, for example, NAND circuits, which have other inputs which may be used, for example, to enable the oscillator.

In a further embodiment of the oscillator according to the invention a drive strength of the logic gate is weaker than a drive strength of the particular one of the inverters. The proper relative strength of the logic gate and the inverter ensures that the oscillation of the oscillator circuit is adjusted by the logic gate, but is not overruled by it so each ring oscillator oscillates due to its feedback via its own cascade, only with a phase or frequency adjustment from the other ring oscillators.

In an embodiment of the oscillator according to the invention the cascaded inverters and the logic gate have a common, adjustable voltage supply. An adjustable supply voltage may, for example, be used to adjust the frequency of oscillation. At the same time, however, it influences the drive strength of the inverters. By adjusting the voltage supply to the logic gates as well, overruling is prevented.

In an embodiment of the oscillator according to the invention each ring oscillator is made up of a first number of inverters, the first number differing by at most one from a second number of oscillation circuits in the loop, said tap point in the ring oscillator being separated by one inverter from the output to which the output of the logic gate comprised in the coupling from a serially preceding oscillator circuit in the loop is connected. In this way approximately the right phase shift, as it occurs between successive inverters in the ring oscillator, is provided a priori, that is, even if the loop were not closed. The closed loop will then easily correct the phase shifts to the intended fractions (the inverse of the second number) of the full period of oscillation.

Under some circumstances, several modes of oscillation are possible. In each mode the sum of the phase differences between successive oscillator circuits must add to 360 degrees or a multiple of 360 degrees. Suppose that a basic mode of oscillation is possible. In this case other modes, wherein each phase difference between successive oscillator circuits differs from the corresponding phase difference in the basic mode and add up to another multiple of 360 degrees, may also be possible. Such other modes can be undesirable because they do not provide the required phase differences between the oscillator circuits.

Another embodiment of the oscillator according to the invention comprises a cross coupling from a first one of the oscillating circuits to its Nth serial successor in the loop, that is, to the oscillator circuit displaced from it by N successive positions along the loop, N being greater than one, the cross coupling being arranged for selectively destabilizing a particular mode of oscillation. In this way an undesired mode of oscillation can be prevented from occurring persistently. If necessary, cross coupling from the first oscillator circuit to several other oscillator circuits may be provided to prevent several undesired modes.

In an embodiment of the oscillator according to the invention each oscillator circuit has a cross coupling to its Nth serial successor in the loop. In this way an oscillator with rotational symmetry is achieved which, as mentioned above, provides delays between the oscillations of successive oscillator circuits which are integer fractions (1/M) of a full period.

In an embodiment of the oscillator according to the invention each oscillator circuit comprises a ring oscillator comprising cascaded inverters, the cross coupling comprising an additional logic gate having an input coupled to said ring oscillator and an output connected to an output of a particular one of the inverters in the Nth successor. In this way it is possible to realize a multiphase output oscillator as part of a digital circuit.

In particular, in an embodiment of the oscillator according to the invention there is an even number of oscillator circuits, N being half said even number, each oscillator circuit comprising a ring oscillator comprising cascaded inverters, the cross coupling comprising an additional inverting logic gate having an input coupled to said ring oscillator and an output connected to an output of a particular one of the inverters in the Nth successor. Two oscillator circuits separated by half the loop will provide maximum phase contrast between modes for which the phase increments between successive oscillator circuits are nearly the same, and add up to 360 degrees around the full loop. By providing the cross coupling oscillation between opposed circuits such nearly similar modes of oscillation are destabilized.

In an embodiment of the ring oscillator according to the invention the drive strength of the additional logic gate is weaker than the drive strength of the particular one of the inverters. The relative strength of the gates ensures that the coupling will desstabilize the undesired mode without interrupting the oscillation altogether. In a further embodiment of the oscillator according to the invention the cross coupling comprises two additional logic gates in anti parallel arrangement. In this way the destablization is strengthened.

When the loop consists of an even number of oscillator circuits, the fraction of the oscillation period by which the oscillator circuits are delayed from each other will be an even fraction. This is impossible for the signals inside individual ring oscillators. In one embodiment the even number is four. Consequently, the oscillator circuits are able to oscillate at a 90 degrees phase difference from each other. This is desirable for a great many circuit applications.

Each oscillator circuit comprises a ring oscillator and the ring oscillator preferably consists of a cascade of three inverters. Three is the minimum number of inverters required for a ring oscillator and provides for the highest attainable oscillation frequency.

BRIEF DESCRIPTION OF THE DRAWING

The invention will be described and its advantageous aspects will be elaborated in connection with the accompanying drawing, in which.

DESCRIPTION OF THE PREFERRED EMBODIMENTS

Figure 1:
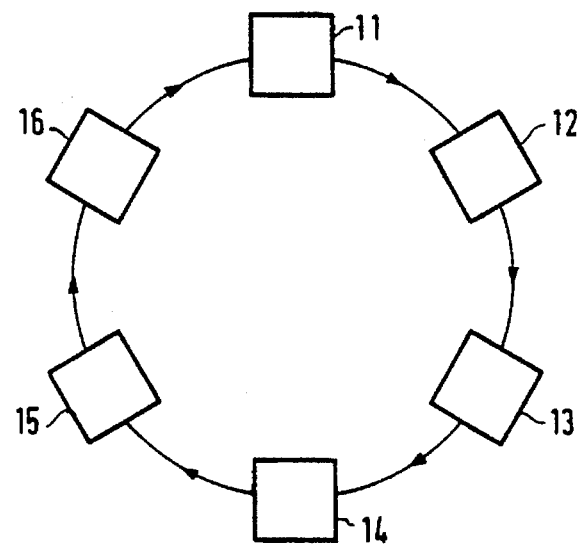
FIG. 1 shows a schematic of an oscillator according to the invention.

FIG. 1 shows an oscillator which contains six oscillator circuits 11, 12, 13, 14, 15, 16. The oscillator circuits 11, 12, 13, 14, 15, 16 are organized in a loop. Each oscillator circuit 11, 12, 13, 14, 15, 16 has an output which is connected to an input of its successor oscillator circuit in the loop.

The oscillator circuits 11, 12, 13, 14, 15, 16 may each, for example, be phase locked loops, the output, in operation, producing an oscillating signal, say of the shape $\cos(\omega\tau+\Phi)$. In the case of a phase locked loop, there is a relation between the phase of the signal received at the input of the phase locked loop and the phase of the oscillating signal produced at the output of the phase locked loop. In the case of the loop shown in FIG. 1, such a relation between the phase $\Phi_j$ of oscillation $\cos(\omega\tau+\Phi_j)$ of the jth oscillator circuit 11, 12, 13, 14, 15, 16 and the phase $\Phi_{j+1}$ of the oscillation signal $\cos(\omega\tau+\Phi_{j+1})$ of its successor can be written as $$\frac{d\Phi_{j+1}}{dt} = f(\Phi_{j+1} - \Phi_j - \Delta) \quad (1)$$

The rate of change of phase $d\Phi_{j+1}/dt$ is the instantaneous frequency of the j+1st oscillator circuit. The function "f" will be periodic, repeating itself when its argument is increased by 360 degrees. Its precise shape depends on the design of the phase locked loop. The phase offset $\Delta$ is introduced because in designing the oscillator circuits 11, 12, 13, 14, 15, 16 it may often be adjusted independent of the shape of the function "f".

According to the invention, the succession forms a loop containing M oscillator circuits 11, 12, 13, 14, 15, 16 (in FIG. 1 M=6) cyclically connected. Hence, none of the oscillator circuits 11, 12, 13, 14, 15, 16 is individually free running since they all receive an input from their predecessor oscillator circuit in the loop. The oscillator circuits in the loop will exhibit a collective oscillation in which the sum of the phase differences between successive oscillator circuits 11, 12, 13, 14, 15, 16 along the loop must add up to 360 degrees or an integer multiple thereof.

This is mathematically formalized in the following way. The series $\Phi_j, j=0\ldots M-1$ can be thought of as part of a series with j running from minus to plus to infinity. In this case, for a loop of M oscillator circuits 11, 12, 13, 14, 15, 16, $\Phi_{j+M}$ and $\Phi_j$ both describe the phase of the same jth oscillator circuit and they should differ by 360 degrees or an integer multiple thereof. In particular $$\Phi_M = \Phi_0 + n \times 360 \quad (2)$$

Where n is any integer. In combination with equation (1) it follows that the following is a possible state of oscillation:

$$\Phi_j = f\left(\frac{360 \times n}{M} - \Delta\right) \times t + \frac{j \times 360 \times n}{M} \quad (3)$$

The term proportional to time, t, represents a shift in oscillation frequency. All oscillator circuits 11, 12, 13, 14, 15, 16 have the same frequency. The term proportional to j describes the phase difference between successive oscillator circuits in the loop. It will be observed that according to equation (3) the oscillator circuits oscillate at fixed phases, spaced from each other by an Mth fraction of the full oscillation period or a multiple thereof. Any fraction may be realized by utilizing an appropriate number M of oscillator circuits 11, 12, 13, 14, 15, 16. The spacing of the phases is independent of the phase offset $\Delta$ defined by equation (1).

Not all values of n correspond to stable states of oscillation. For a state to be stable, deviations from the solution in equation (3) should disappear in time. A condition for this is that the derivative of the function f is negative:

$$\left[\frac{df(x)}{dx}\right]_{x=\frac{360n}{M}-\Delta} < 0 \quad (4)$$

If this derivative is not negative, the state of oscillation will not be stable and will not occur in practice. Because it depends on phase, the function f will be periodic; there will always be at least one argument x for which its derivative is negative. By adjustment of the phase offset $\Delta$ of coupling, this argument can be made to correspond with the desired value of n. Preferably, the coupling is designed such that the range of arguments x for which the derivative of the coupling function f is negative is sufficiently small and well placed that only one value of n falls into it according to equation (4).

In the description given above, it was assumed that the oscillator circuits 11, 12, 13, 14, 15, 16 were identical. For example, they have identical basic frequencies $\omega$, coupling functions f, and offsets $\Delta$. This is not necessary. Differences in basic frequencies $\omega$ will have no effect upon the phase distribution. Differences in coupling functions, f, and offsets $\Delta$ will make the spacing of the oscillation phases of different oscillator circuits 11, 12, 13, 14, 15, 16 unequal. As a consequence, the spacing in this case, although fixed, will in general not be by integer fractions of the full period.

A Loop of Ring Oscillators

Figure 2:
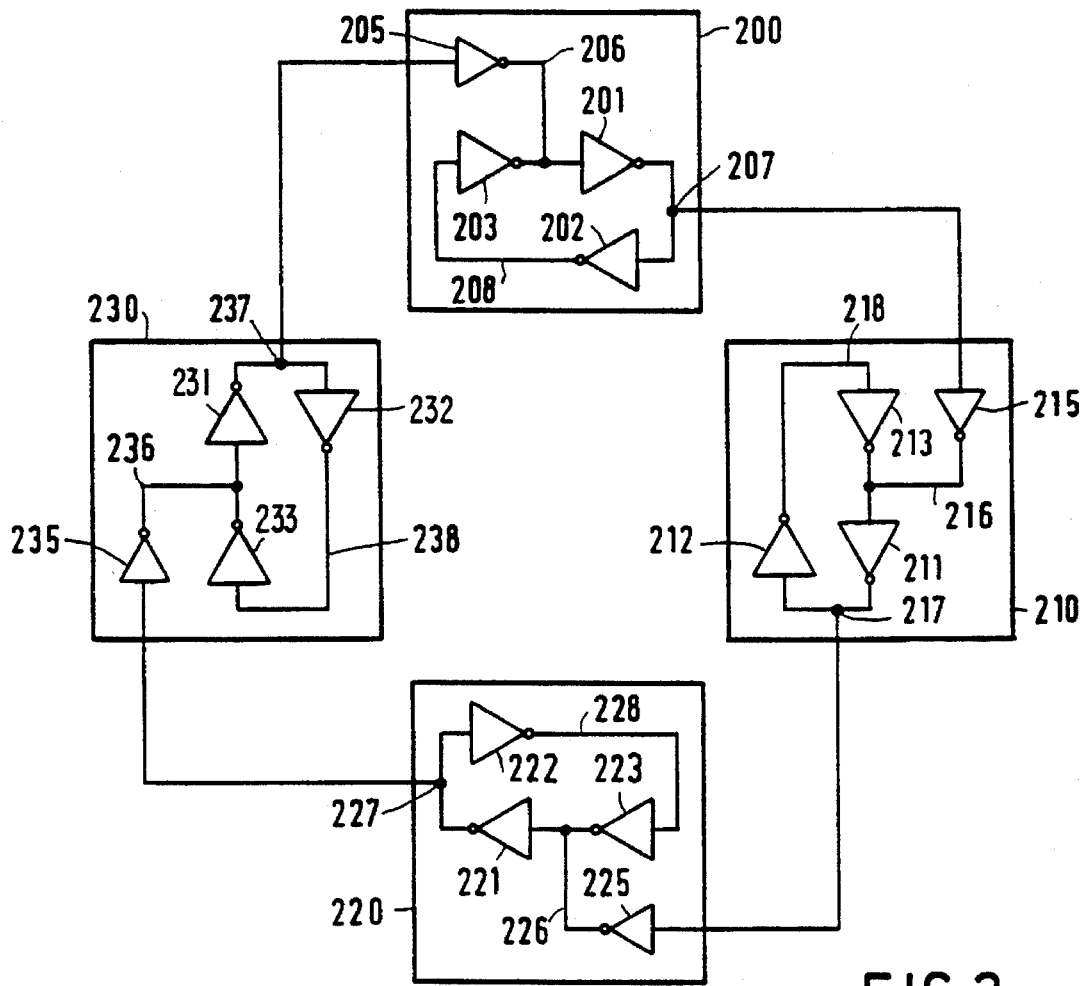
FIG. 2 shows an embodiment of the oscillator according to the invention which uses logic inverter gates.

FIG. 2 shows an embodiment of the oscillator according to the invention implemented using logic inverter gates. Such gates are particularly suitable for implementing the invention in digital integrated circuits.

In FIG. 2, the oscillator comprises four oscillator circuits 200, 210, 220, 230. Each oscillator circuit contains three inverters (201, 202, 203), (211, 212, 213), (221, 222, 223), (231, 232, 233) in a ring oscillator configuration.

The oscillator circuits 200, 210, 220, 230 form a loop in which each oscillator circuit 200, 210, 220, 230 is coupled to its successor via a logic gate 205, 215, 225, 235, shown as a further inverter in FIG. 2. The input of each logic gate 205, 215, 225, 235 is tapped from the ring in a respective oscillator circuit 200, 210, 220, 230. The output of each logic gate 205, 215, 225, 235 is connected to the output of an inverter in the successor of this respective oscillator circuit 200, 210, 220, 230. The tap point 207, 217, 227, 237 for the input and the connection point 206, 216, 226, 236 for the output are at the output and input respectively of the same inverter 201, 211, 221, 231 in each oscillator circuit.

Figure 3:
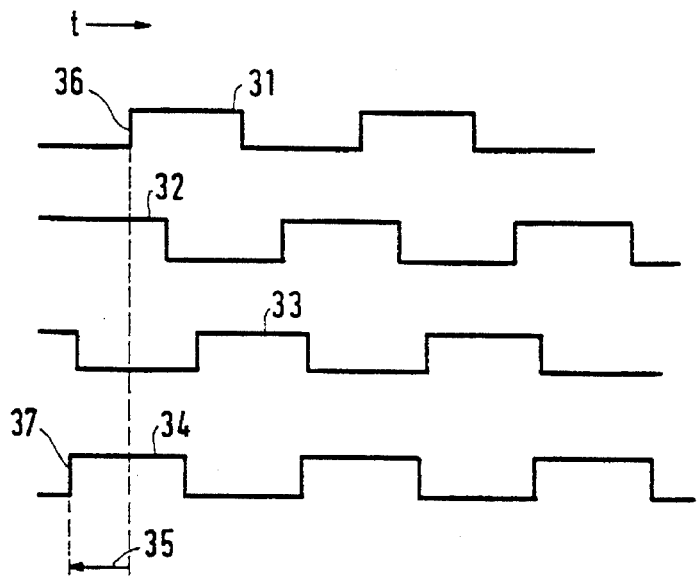
FIG. 3 shows the timing relation of a number of signals occurring in a ring oscillator.

The signals occurring in each oscillation circuit are shown in FIG. 3. This Figure shows a number of idealized traces of binary signals. The transitions between high and low levels are depicted as instantaneous to emphasize timing relationships, although in practice they may be far from instantaneous.

A first trace 31 shows the output of a first inverter, say 201, in one oscillator circuit 200. The second and third trace 32, 33 show the outputs of the second and third inverters 202, 203, respectively, in this one oscillator circuit 200. Because the number of inverters in the ring is odd, it is impossible to have a logically consistent state of alternate high and low levels at the output of successive inverters in the ring. Instead, each inverter produces periodic high to low transitions and vice versa. Each transition at the output of an inverter in the ring causes, after some delay, a transition at the output of the next inverter in the ring. After six such transitions, the combination of traces of the output of the inverters repeats itself. The oscillation period is therefore six delay times.

Figure 4:
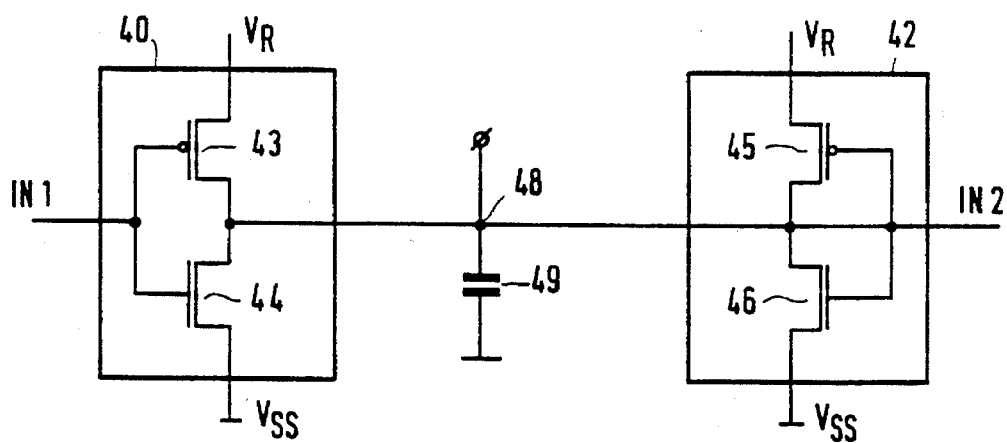
FIG. 4 shows a transistor diagram of two inverters with connected outputs.

One mechanism responsible for the delay time is illustrated using FIG. 4. This Figure shows an inverter 40 and a logic gate implemented as a further inverter 42. The further inverter 42 will be discussed below. The inverter 40 contains a PMOS transistor 43 and an NMOS transistor 44. The channels of these transistors 43, 44 are connected in series between a first and second supply terminal Vr and VSS. The gates of the transistors 43, 44 are connected and form the input IN1 of the inverter 40. A node 48 between the channels of the transistors 43, 44 forms the output 48 of the inverter 40. The output 48 is loaded with a capacitor 49. This capacitor 49 may be due to parasitics, or it may be intentionally provided.

In operation, suppose a transition occurs at the input IN1 of the inverter 40, say from high a to low voltage, and consider the output voltage. Initially the output will be at a low voltage. After the transition, the PMOS transistor will start charging the capacitor 49, causing the output voltage to rise. The delay time of the inverter 40 for a transition from low to high at the output corresponds to the time needed for the output voltage to reach the high level. The delay time depends on the capacitance value of the capacitor 49, the drive strength of the PMOS transistor 43, and the supply voltage Vr. Similarly, the high to low output delay of the inverter depends on the drive strength of the NMOS transistor 44. In a CMOS integrated circuit, the drive strength of the transistors 43, 44 can be adjusted by varying the W/L ratio, i.e. the ratio of the width of source and drain to the distance (gate length) between them. Similarly, the supply voltage $V_r$ or the capacitance value of the capacitor 49 may be adjusted in order to adjust the frequency of oscillation.

FIG. 2 also shows the logic gates 205, 215, 225, 235 coupling the oscillator circuits 200, 210, 220, 230. The logic gates 205, 215, 225, 235 have their outputs connected to the output of respective inverters 203, 213, 223, 233 in the oscillator circuits 200, 210, 220, 230. At the transistor level this corresponds to the situation shown in FIG. 4. Here one of the logic gates, implemented as a further inverter 42 is shown with its output connected to the inverter 40. The construction (PMOS 45 and NMOS 46) of the further inverter 42 is similar to that of the inverter 40, but the further inverter 42 has a weaker drive strength. This can be achieved by providing the further inverter 42 with transistors 45, 46 having a smaller W/L ratio than that of the transistors 43, 44 in the inverter 40 (for example, a half or a quarter of their W/L ratio or even smaller).

In operation, because it is stronger, the inverter 40 will determine the output level of the two connected inverters 40, 42. The inverter 40 overrules the further inverter 42. However, the further inverter 42 can increase or decrease the delay time it takes to reach the output level. When the input signal at the input IN2 of the further inverter 42 is at a low level when the input signal of the inverter 40 goes from high to low, this will speed up the charging of the capacitor 49, and thus decrease the delay time. When the input IN2 is at a high level during a high to low transition, this will slow down charging, increasing the delay time. When input IN2 of the further inverter 42 itself receives a transition during the charging period, charging will be slowed down before the transition at the input IN2 and speeded up after the transition at the input IN2 or vice versa. The net effect on the delay time varies in proportion to the time lag between the transitions at the inputs IN1 and IN2. In other words, the relative phase of the signals at the inputs IN1, IN2 will continuously affect the delay time of the inverter 40.

An increase or decrease in delay time will mean respectively an increase or decrease in the time needed before the ring oscillator completes a full period. This corresponds to a change in phase of oscillation. Hence, there is a relation between the change of phase of the ring oscillator and the difference in phase between it and its predecessor. This relation gives rise to a function "f" as used in equation (1).

Figure 5:
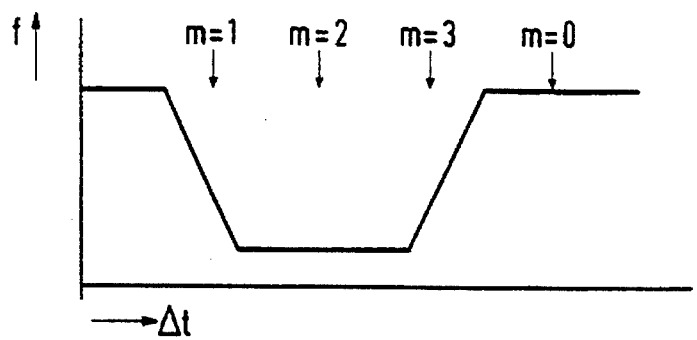
FIG. 5 shows a graph of phase pulling versus phase difference.

An idealized graph of "f" versus phase difference for the output to output connected inverters of FIG. 4 is shown in FIG. 5. In relation to FIGS. 2 and 3 the following assumptions hold:

the output signals of the inverters 201, 202, 203 in the oscillator circuit 200 are as shown in the traces 31, 32, 33, respectively, the input signal of the logic gate 205, which has its output coupled to the output of the third inverter 203 in the oscillator circuit 200, is as shown in the trace 34 shown in FIG. 3, and the horizontal coordinate in FIG. 5 corresponds to the time distance 35 between the transitions 36, 37 in the traces 31, 34. Zero phase difference corresponds to the state in which the inverters 201 and 231, whose inputs are connected to the respective logic gates 205, 235, are exactly in phase.

The phase differences corresponding to various values of n in equation (3) are indicated by arrows in FIG. 5. It will be noted that only the case n=1 corresponds to a stable solution according to equation (4). Hence, in the idealized case, the oscillator circuits 200, 210, 220, 230 will oscillate at a 90 degree phase distance from each other.

The value of n which corresponds to stable oscillation can be chosen by means of the coupling and in particular by adjusting the value of Δ. In FIG. 2, the logic gates 205, 215, 225, 235 have their inputs connected respectively to a node 237, 207, 217, 227 at the output of a respective inverter 231, 201, 211, 221 in each oscillator circuit 230, 200, 210, 220. The logic gates 205, 215, 225, 235 (here in fact CMOS inverters) have their outputs connected respectively to a node 206, 216, 226, 236 at the input of the respective inverters 201, 211, 221, 231 in each oscillator circuit 200, 210, 220, 230.

Since there are three inverters in each oscillator circuit 200, 210, 220, 230, there is, apart from an inversion, approximately 120 degrees phase difference between the input of the coupling to and the output of the coupling from the oscillator circuit 200, 210, 220, 230. Because the logic gates 205, 215, 225, 235 have an inverting action, this means that if the loop of oscillator circuits 200, 210, 220, 230 were not closed, the phase of oscillation (at the points 237, 207, 217, 227 where inputs for the logic gates 205, 215, 225, 235 are tapped) would differ 120 degrees between pairs (200, 210), (210,220), (220,230), (230,200) of successive oscillator circuits. This phase difference determines where the region of negative slope of "f" occurs in FIG. 4.

The points (237,206), (207,216), (217,226), (227,236) where the logic gates 205, 215, 225, 235 are connected to the ring oscillator may be changed from the position shown in FIG. 2 without detracting from the invention. For example, when the input and output to the logic gates 205, 215, 225, 235 are placed two inverters apart (say at (237,208), (207, 218), (217,228), (227,238)) the phase difference between input and output is 240 degrees. This corresponds to an increase of Δ by 120 degrees. Correspondingly, in this case n=3 would yield a stable oscillating state.

When more than 3 inverters (that is, 5, 7 etc.) are used in the ring oscillators 200, 210, 220, 230 there are even more choices for the number of gates between input and output coupling. Suppose there are L inverters in the oscillator circuits 200, 210, 220, 230, and M oscillator circuits 200, 210, 220, 230 in the loop. In this case n=1 oscillation will be stable when the input and output coupling are placed l inverters apart, where l is as close as possible to L/M.

Figure 6:
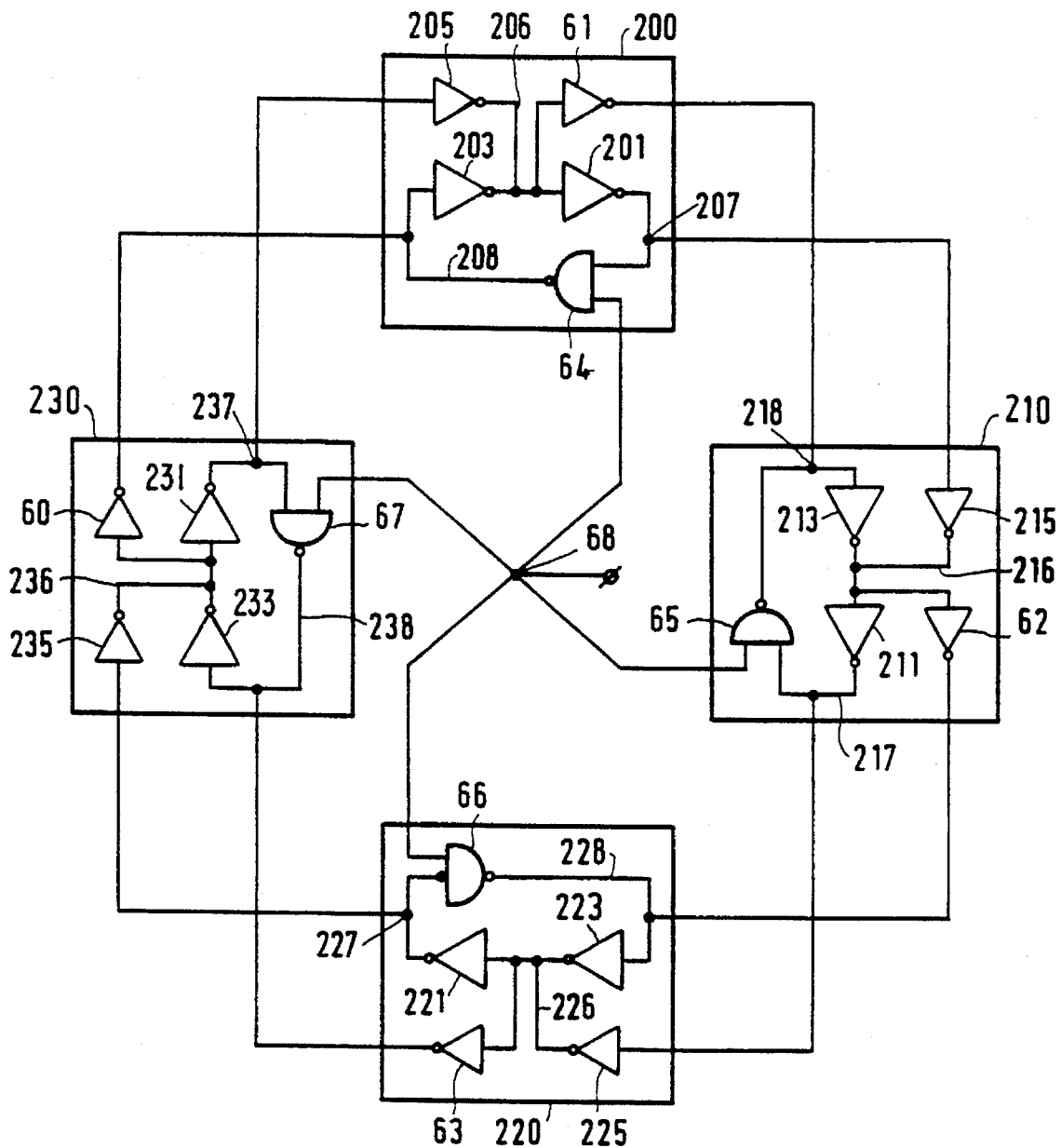
FIG. 6 shows a further embodiment of the oscillator according to the invention.

Of course, apart from the coupling via logic gates 205, 215, 225, 235 such as shown in FIG. 2 there are many other ways of realizing the coupling in an oscillator according to the invention. By way of example, FIG. 6 shows an alternative where each coupling consists of two logic gates (205,60), (215,61), (225,62), (235,63) (implemented as inverters). This will provide a stronger coupling between the oscillator circuits 200, 210, 220, 230, even if the drive strength of the individual logic gates is kept the same. (Another, independent difference between FIG. 2 and FIG. 6 is that one of the inverters 202, 212, 222, 232 in each of the oscillator circuits 200, 210, 220, 230 has been replaced by a NAND gate 64, 65, 66, 67).

In FIG. 6 the two logic gates (205,60), (215,61), (225,62), (235,63) in each coupling provide coherent coupling for the following reason. There are two signal paths from any node in one oscillator circuit (say 230) to its successor 200: for example, from the node 236 where the first of the logic gates 60 receives its input to the node 206 where the second of the logic gates 205 delivers its output, there are two paths (60,208,203) and (231,237,205). The propagation delays along both paths are equal, that is, the sum of the propagation delay of the one logic gate 60 and the propagation delay of the part 203 of the ring oscillator 200 in one path is equal to the corresponding sum in the other path. Because of the equality of propagation delays, the coupling is coherent, i.e. both logic gates 60, 205 individually would tend to drive the successor 200 to the same phase relation with the oscillator circuit 230.

Without deviating from the invention, the ring oscillators may contain an odd number of inverters greater than three. Another feature shown in FIG. 6 is that one of the inverters 202, 212, 222, 232 in each of the oscillator circuits 200, 210, 220, 230 has been replaced by a NAND gate 64, 65, 66, 67. The first inputs of all the NAND gates 64, 65, 66, 67 are part of the ring oscillators; the second inputs of the NAND gates 64, 65, 66, 67 are connected together to an enable input 68, which may be used to stop and start the oscillator. One may use multi-input (e.g. NAND, NOR) gates instead of any of the inverters 201, 202, 203, 211, 212, 213, 221, 222, 223, 231, 232, 233, the extra input serving, for example, as an input to disable oscillation, or to impose a specified initial state to the oscillator circuits. Also, any number of non-inverting circuits may be included in the ring. However, the use of only three inverters 201, 202, 203 will provide for a maximum possible oscillation frequency.

In order to ensure evenly spaced phase distances between the oscillator circuit 200, 210, 220, 230 it is preferred that the oscillator be organized in a rotationally symmetric way. This means that the oscillators 200, 210, 220, 230 are identical to each other, and that the logic gates 205, 215, 225, 235 are identical to each other. Also, any further coupling to, from, or within the oscillator should be repeated identically M times along the loop to preserve its rotational symmetry.

Figure 11:
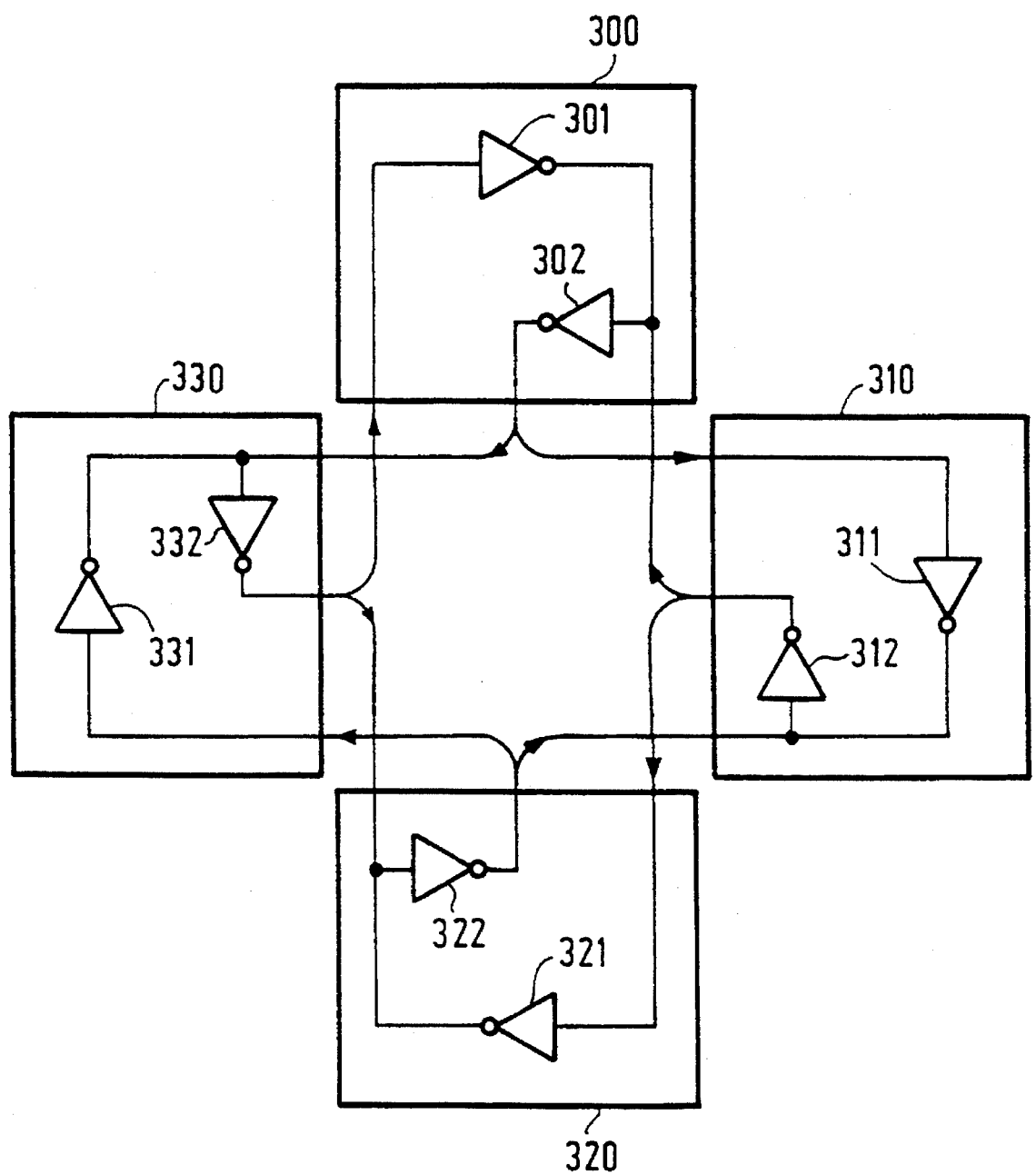
FIG. 11 shows a further embodiment of the oscillator according to the invention.

FIG. 11 shows a further embodiment of the oscillator where the coupling between the oscillator circuits is achieved by sharing a logic gate between each successive pair of oscillator circuits.

In FIG. 11 the oscillator comprises four oscillator circuits 300, 310, 320 and 330. Each oscillator circuit comprises two invertors (301, 302) (311, 312) (321, 322) and (331, 332) in a ring oscillator configuration which is completed by a coupling via an inverter in the next oscillator circuit. Thus, the oscillator circuits form a loop in which each oscillator circuit is coupled to its successor.

Without deviating from the invention, more than four oscillator circuits 300, 310, 320, 330 each sharing an inverter with its successor may be used to build an oscillator like that in FIG. 11. More than two inverters may be used per oscillator circuit, and more than one inverter may be shared.

In order to obtain symmetric signals it is desirable that equivalent inverters in each oscillator circuit 300, 310, 320, 330 are of the same dimensions, that is inverters 301, 311, 321, 331 should have mutually the same dimension and inverters 302, 312, 322, 332 should have mutually the same dimensions. These two dimensions may be varied relative to each other in order to ensure reliable oscillation under all power supply conditions. This does not affect the symmetry of the signals or their quadrature relationships.

Modes of Oscillation

As was noted in equation (3), in an oscillator according to the invention there may be several different phase relationships between oscillations in the oscillation circuits 11, 12, 13, 14, 15, 16. Different phase relationships correspond to different integer values of "n" in equation (3), which satisfy the condition of equation (4). Oscillations for different values of "n" will be called different modes of oscillation.

The possible existence of more than one mode of oscillation may be undesirable, for example, because it makes the phase relationships unpredictable, or because they yield unwanted phase relationships. For example in an oscillator with four oscillator circuits M=4, the mode n=2 will provide oscillations spaced by 180 degrees and not by 90 degrees, and this may be unwanted. Usually the unwanted modes have n values adjacent to the basic intended mode: e.g. the n=2 mode when n=1 is intended.

For the oscillator shown in FIG. 2, according to the idealized FIG. 5 such oscillation modes are impossible. In practice however, due to deviations from the ideal, they may occur under some circumstances.

Unwanted oscillation modes may be prevented by supplementing the coupling from each oscillator circuit and its successor with a cross-coupling from each oscillator circuit to an indirect successor further down the loop. This has the effect of expanding equation (1)

$$\frac{d\Phi_{j+1}}{dt} = f(\Phi_{j+1} - \Phi_j - \Delta) + g(\Phi_{j+1} - \Phi_{j+1-N} - \Delta_N) \quad (5)$$

The function g represents the effect of a coupling received from the j+1-Nth oscillator circuit which precedes the j+1th circuit by N positions in the loop. The possible states of oscillation are:

$$\Phi_j = \left( f\left( \frac{360 \times n}{M} - \Delta \right) + g\left( \frac{360 \times n \times N}{M} - \Delta_N \right) \right) \times \\ t + \frac{j \times 360 \times n}{M} \quad (6)$$

and again only those modes which satisfy the following relation are stable:

$$\left[ \frac{df(x)}{dx} \right]_{x = \frac{360n}{M} - \Delta} + \left[ \frac{dg(x)}{dx} \right]_{x = \frac{360 \times n \times N}{M} - \Delta_N} < 0 \quad (7)$$

The undesired modes may be avoided by providing additional cross-couplings which produce a term "g" which selectively makes this expression positive for the undesired modes. This may be achieved by selecting N, and/or by choosing a type of cross-coupling which leads to an appropriate coupling function "g". Very often, it will not be necessary to make the cross coupling as strong as the coupling between successive oscillator circuits. This is because the term in "f" in equation (7) is usually less negative for the undesired modes as compared to the desired modes. A weaker cross coupling is advantageous as it reduces the risk that other modes are made stable by the cross coupling.

To screen pairs of tap points for suitability as connection points for the cross coupling, the following steps are very effective.

Consider two tap points of different oscillator circuits in the loop.

Determine a first phase difference between two signals at these tap points in the desired mode.

Determine a second phase difference between two signals at these tap points in the undesired mode.

If the difference between the first and second phase difference is approximately 180 degrees, then the two tap points are very suitable for providing a cross coupling. Such a cross coupling should be arranged to counteract the stability of the undesired mode, that is, the derivative of the corresponding function g should be positive for the undesired mode. The cross coupling will then automatically support the desired mode: the derivative of the function g will be negative for this mode.

For example, suppose the desired and the undesired mode have adjacent values of n, i.e. n and n+1. In this case the difference between the first and second phase difference increases by 360/M each time the signals are tapped at an oscillator one step further along the loop. In oscillators containing a loop with an even number of oscillator circuits, halfway the loop the difference is 180 degrees. Therefore, a cross coupling may be provided between oscillator circuits which are halfway the loop. This cross coupling should oppose the undesired mode; it will then automatically support the desired mode.

Figure 7:
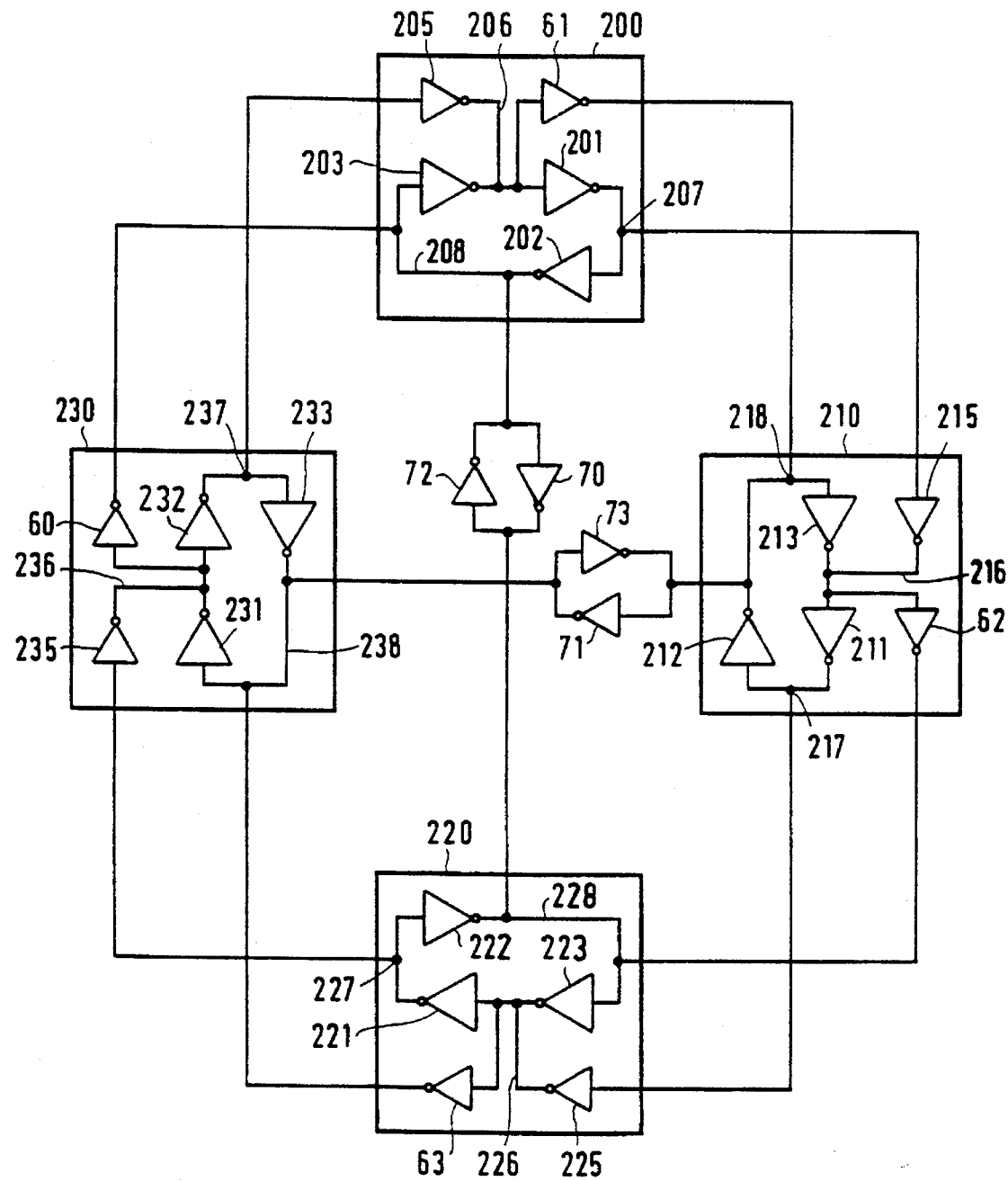
FIG. 7 shows an embodiment of the oscillator according to the invention comprising cross couplings.

An example of this is given in FIG. 7. This Figure is largely similar to FIG. 6, only cross coupling inverters 70, 71, 72, 73 are provided between oscillator circuits 200, 210, 220, 230 respectively which are halfway the loop with respect to each other.

In operation, the cross coupling inverters destabilize the mode n=2 in which the oscillator circuits 200, 210, 220, 230 at opposite sides of the loop oscillate in phase with each other. The cross coupling supports the mode n=1 where the opposite sides are 180 degrees out of phase.

To prevent undesired modes, it may be sufficient to provide only cross coupling between a single pair of oscillator circuits 200, 210, 220, 230. However, in order to maintain the symmetry of the oscillator which guarantees 90 degree phase distances, it is preferred that the cross couplings are provided similarly at all positions in the loop, i.e. from each jth position to a j+Nth position.

Interfacing

The oscillator according to the invention will require various interface connections to a further circuit. For example it may need an input for adjusting the oscillation frequency and outputs for outputting the oscillation signal produced.

Figure 8:
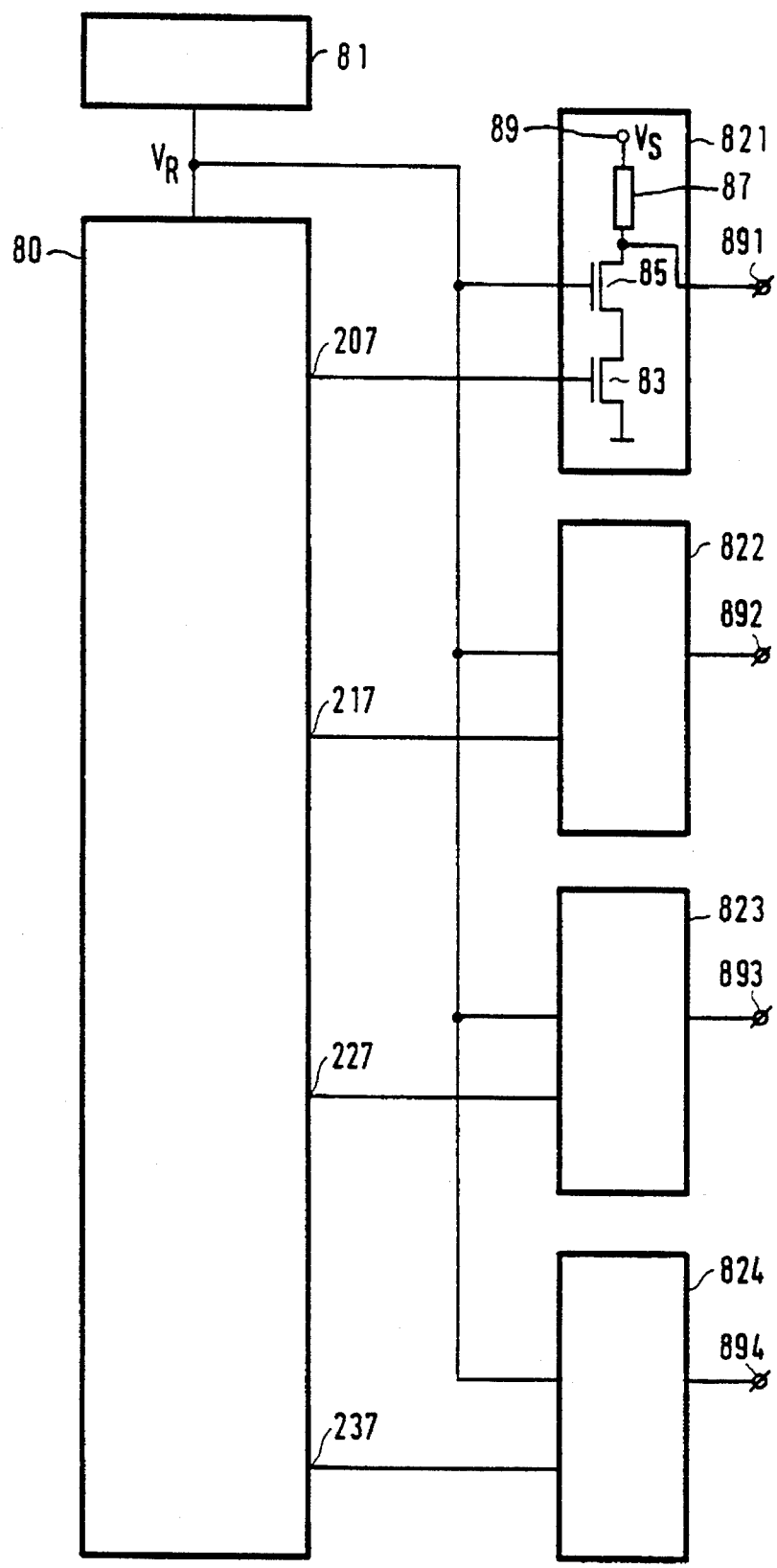
FIG. 8 shows an output circuit for the oscillator according to the invention.

FIG. 8 shows interface circuitry for coupling the oscillator to further circuits. The oscillator itself is shown as a single block 80. The interface circuitry contains a voltage supply circuit 81 which has an output coupled for supplying all inverters 201, 202, 203, 211, 212, 213, 221, 222, 223, 231, 232, 233, 205, 215, 225, 235 etc. contained in the oscillator 80. The tap points 207, 217, 227, 237 are connected to four buffers 821, 822, 823, 824, respectively. The internal structure of one of the buffers 821 is shown. It contains a serial connection of the channels of a first NMOS transistor 83 and a second NMOS transistor 85 and a load circuit 87. This serial arrangement is connected between a power supply terminal 89 and ground. A node 891 between the load and the channel of the second transistor 85 is the output of the buffer 821. The other buffers 822, 823, 824 which have outputs 892, 893, 894 are not shown in detail. Their structure and connections are similar to that of the buffer 821 so that the oscillator 80 is not asymmetrically loaded.

The gate of the first NMOS transistor 83 is connected to a tap point 207 of the oscillator 80. The gate of the second NMOS transistor 85 is connected to the supply circuit 81.

As has been described hereinbefore, the oscillator 80, in operation, will produce several signals with precisely defined phase relations. The frequency of these signals may be adjusted without affecting the phase relations. Such a frequency adjustment may be provided by varying the voltage $V_r$ supplied at the output of the voltage supply circuit 81 to the inverters 201, 202, 203, 211, 212, 213, 221, 222, 223, 231, 232, 233 in the ring oscillators. The variation of the supply voltage $V_r$ will affect the drive strength of all inverters and thereby the delay times and hence the oscillation frequency. Adjustment of the supply voltage $V_r$ may entail the risk that by this adjustment the drive strength of any of the inverters in the oscillator circuits drops below that of the logic gates 205, 215, 225, 235. To avoid this, the voltage supplied to these logic gates 205, 215, 225, 235 is preferably varied along with that supplied to the other inverters in the oscillator circuits.

Alternatively, the frequency may be varied by including the channels of pass transistors between the inverters 201, 202, 203 in the ring oscillators and varying the voltage at the gates of these pass transistors.

The buffers 821, 822, 823, 824 serve to convert the oscillation signals to digital signals with a voltage swing defined with respect to the external supply voltage $V_s$ (and not to the adjustable supply voltage $V_r$). This is achieved using the first transistor 83 in the buffer 821.

The supply voltage $V_s$ may be subject to fluctuations. In order to prevent that through capacitive effects these fluctuations affect the frequency or phase of the oscillation signals in the oscillator 80, the second NMOS transistor 85 is provided. The second transistor 85 is in cascade arrangement with the first transistor 83. The second transistor has its gate connected to the output of the supply circuit 81 and is supplied with the same voltage $V_r$ as the inverters in the oscillator 80. Thus, the voltage at the drain of the first transistor 83 is independent of fluctuations in the external supply voltage $V_s$. Such fluctuations cannot therefore affect the oscillator 80 via the buffer.

It should be noted that the buffers 821, 822, 823, 824 have been provided in the same way for each of the oscillator circuits 200, 210, 220, 230. This has been done to preserve the rotational symmetry of the circuit even at its outputs and thereby to ensure the accuracy of the 90 degree phase shift. For an oscillator with a number of oscillator circuits other than three, one should preferably also provide buffers in the same way for each oscillator circuit to preserve symmetry.

The signals at the outputs of the buffers 821, 822, 823, 824 may be processed in various ways. One circuit for further processing is shown in FIG. 9.

Figure 9:
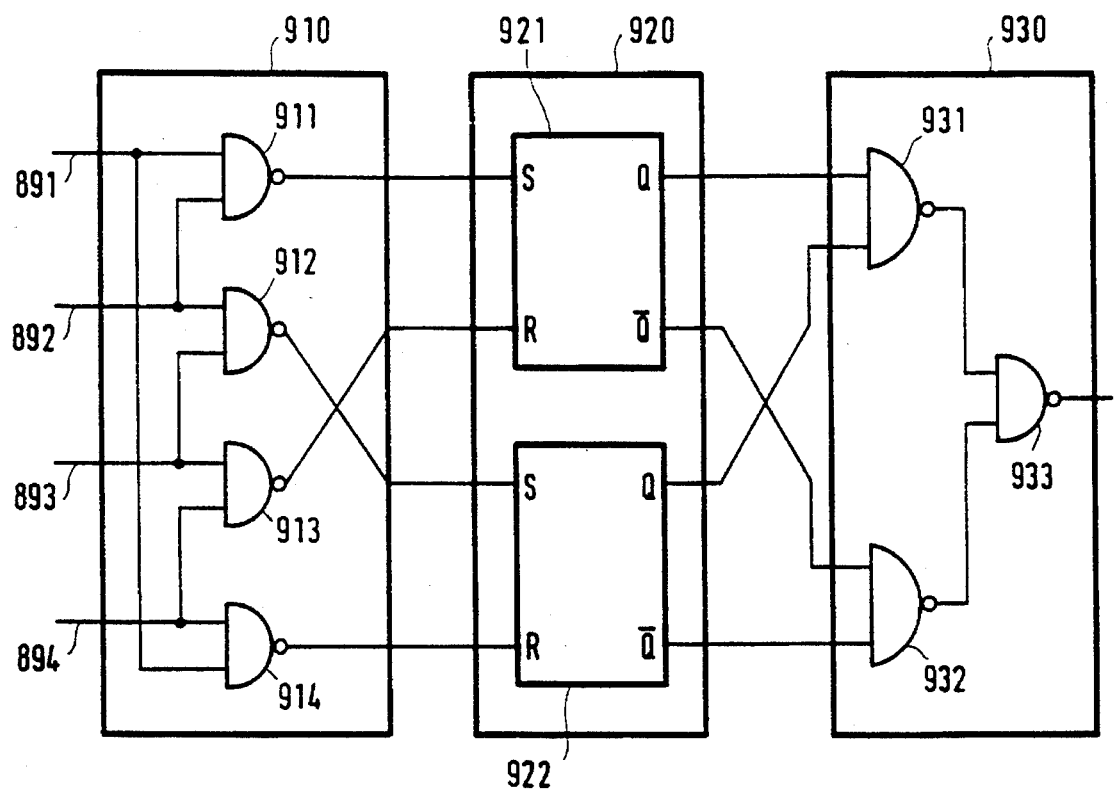
FIG. 9 shows a circuit for further processing of the oscillator signal.

The circuit in FIG. 9 contains three stages in series. The first stage is a pulse forming circuit 910 containing four two input NAND gates 911, 912, 913, 914. The second stage is a 50% duty cycle recovery circuit 920 containing two set/reset flip flops 921, 922. The third stage is a frequency doubling circuit 930 containing three NAND gates 931, 932, 933.

The NAND gates 911, 912, 913, 914 in the pulse forming circuit 910 each receive signals from the outputs 891, 892, 893, 894 of a pair of buffers (821,822) (822,823), (823,824), (824,821). Signals representing successive adjacent phases of oscillation are supplied in each pair (821,822) (822,823), (823,824), (824,821). In this way four phases of pulses (pulse=low signal) are formed at the four outputs of the NAND gates 911, 912, 913, 914. The pulses, which are 180 degrees out of phase, have no overlap.

The first and second set/reset flip-flops 921, 922 in the 50% duty cycle recovery circuit 920 are set or reset by a low signal at the set or reset input, respectively. These flip-flops 921, 922 may, for example, be cross coupled NAND gates. Thus, the voltage at the drain of the first transistor 83 is independent of fluctuations in the external supply voltage $V_s$. Such fluctuation cannot therefore affect the oscillator 80 via the buffer.

The first set/reset flip-flop 921 in the 50% duty cycle recovery circuit 920 receives at its set and reset input respective pulses which are 180 degrees out of phase. The second set-reset flip-flop 922 receives pulses which are 90 degrees out of phase from those received at the first flip-flop 921. Both flip-flops 921, 922 will form signals with a 50% duty cycle, but 90 degrees out of phase with each other.

The 50% duty cycle signal from one flip-flop 921 and the inverse of the signal from the other flip-flop 922 are supplied to the inputs of a NAND gate 931 of the frequency doubling circuit 930. In response, this NAND gate forms a first 25% duty cycle signal. A second, similar NAND gate 932, which receives the inverse of the signals at the first NAND gate 931, forms a second 25% duty cycle signal. This second signal is 90 degrees out of phase with the first signal. The first and second signals are NANDED to form a double frequency signal.

The function of the NAND gates 911, 912, 913, 914 may be combined with the buffer circuits 821, 822, 823, 824. An adapted buffer circuit 1000 for this purpose is shown in FIG. 10.

Figure 10:
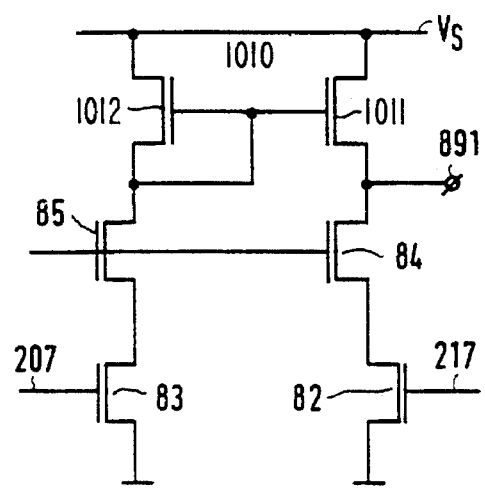
FIG. 10 shows a further output circuit for the oscillator according to the invention.

FIG. 10 shows two serial arrangements similar to the one shown in FIG. 8. Each arrangement comprises a first 82, 83 and second 84, 85 NMOS transistor. However, the load 87 is now realized in the form of a current mirror 1010 comprising two PMOS transistors 1011, 1012 with their drains connected to the drains of the second transistors 84, 85 in respectively the first and second serial arrangement. The gates of the first transistors 82, 83 are supplied with oscillation signals from the oscillator 80 which have successive adjacent phases. The leading one of the two phases is input to the serial arrangement which contains the output. The lagging phase is given greater drive strength than the leading phase via the current mirror 1010.

Like the combination of the buffer circuits 821, 822, 823, 824 with the NAND gates 911, 912, 913, 914 the adapted buffer circuit will form pulses of less than 50% duty cycle which may be used to supply the 50% duty cycle recovery circuit 920.

The circuits 910, 920, 930 in FIG. 9 are shown for use with oscillators which produce 90 degree phase shifted signals. In this case four NAND gates 911, 912, 913, 914 and two flip flops 921, 922 are used. Of course when more different phases are used, other combinations may be used. For example, by supplying different phase pairs to the flip flops, precise 33.3%, 25%, 20% etc. duty cycle signals instead of 50% duty cycle signals may be provided at precisely related phases. A complete set of such signals at different phases may then be combined to generate a frequency multiplication by 3, 4, 5 or higher.

We claim:

1. A multiphase output oscillator which comprises:
   a plurality of oscillator circuits coupled together to form a loop of serially coupled oscillator circuits,
   means for coupling each particular oscillator circuit in the loop to its respective serial predecessor oscillator circuit in the loop, the coupling means simultaneously providing each particular oscillator circuit with adjustment of frequency and/or phase of an oscillating signal of that particular oscillator circuit, dependent upon a respective difference between the phase of the oscillation signal in that particular oscillator circuit and a phase of the oscillation signal in its respective serial predecessor oscillator circuit, so as to maintain, in operation, said respective phase difference.

2. An oscillator according to claim 1, wherein all oscillator circuits in the loop are substantially identical to each other and all couplings are substantially identical to each other.

3. An oscillator according to claim 2, each oscillator circuit comprising a ring oscillator comprising cascaded inverters, each coupling comprising a logic gate, having an output coupled to a tap point in said ring of its respective oscillator circuit and an input connected to an output of a particular one of the inverters in the ring oscillator in the predecessor oscillator circuit.

4. An oscillator according to claim 3, wherein a drive strength of the logic gate is weaker than a drive strength of the particular one of the inverters.

5. An oscillator according to claim 1, each oscillator circuit comprising a ring oscillator comprising a cascade circuit of inverters, each coupling comprising a respective shared inverter common to the particular oscillator circuit and its predecessor oscillator circuit.

6. An oscillator according to claim 3, wherein each ring oscillator is made up of a first number of inverters, the first number differing by at most one from a second number of oscillation circuits in the loop, said tap point in the ring oscillator being separated by one inverter from the input to the logic gate comprised in the coupling to a serially succeeding oscillator circuit in the loop.

7. An oscillator according to claim 1, comprising a cross coupling from a first one of the oscillator circuits to its Nth serial successor oscillator circuit in the loop, that is, to the oscillator circuit displaced from it by N successive positions along the loop, N being greater than one, the cross coupling being arranged for selectively destabilizing a particular mode of oscillation.

8. An oscillator according to claim 7, each oscillator circuit having cross coupling to its Nth serial successor oscillator circuit in the loop.

9. An oscillator according to claim 7, wherein there is an even number of oscillator circuits, N being half said even number, each oscillator circuit comprising a ring oscillator comprising cascaded inverters, the cross coupling comprising an inverting logic gate having an input coupled to a respective said ring oscillator, and an output connected to an output of a particular one of the inverters in the Nth successor oscillator circuit.

10. An oscillator according to claim 9, the cross coupling comprising two additional logic gates connected in anti parallel arrangement.

11. An oscillator according to claim 1, each oscillator circuit comprising a ring oscillator comprising cascaded inverters, each coupling comprising a logic gate having an output coupled to a tap point in said ring of its respective oscillator circuit and an input connected to an output of a particular one of the inverters in the ring oscillator in the predecessor oscillator circuit.

12. An oscillator according to claim 2, each oscillator circuit comprising a ring oscillator comprising a cascade circuit of inverters, each coupling comprising a respective shared inverter common to the particular oscillator circuit and its predecessor oscillator circuit.

13. An oscillator according to claim 11, wherein each ring oscillator is made up of a first number of inverters, the first number differing by at most one from a second number equal to the number of oscillator circuits in the loop, said tap point in the ring oscillator being separated by one inverter from the input to the logic gate comprised in the coupling to a serially succeeding oscillator circuit in the loop.

14. An oscillator according to claim 5, wherein each ring oscillator is made up of a first number of inverters, the first number differing by at most one from a second number equal to the number of oscillation circuits in the loop, each coupling comprising a logic gate having an output coupled to a tap point in said ring oscillator of its respective oscillator circuit and an input connected to an output of a particular one of the inverters in the ring oscillator in the predecessor oscillator circuit, said tap point in the ring oscillator being separated by one inverter from the input to the logic gate comprised in the coupling to a serially succeeding oscillator circuit in the loop.

15. An oscillator according to claim 2, comprising a cross coupling from a first one of the oscillator circuits to its Nth serial successor oscillator circuit in the loop, that is, to the oscillator circuit displaced from it by N successive positions along the loop, N being greater than one, the cross coupling being arranged for selectively destabilizing a particular mode of oscillation.

16. An oscillator according to claim 11, comprising a cross coupling from a first one of the oscillator circuits to its Nth serial successor oscillator circuit in the loop, that is, to the oscillator circuit displaced from it by N successive positions along the loop, N being greater than one, the cross coupling being arranged for selectively destabilizing a particular mode of oscillation.

17. An oscillator according to claim 16, each oscillator circuit having a cross coupling to its Nth serial successor oscillator circuit in the loop.

18. An oscillator according to claim 13, comprising a cross coupling from a first one of the oscillator circuits to its Nth serial successor oscillator circuit in the loop, that is, to the oscillator circuit displaced from it by N successive positions along the loop, N being greater than one, the cross coupling being arranged for selectively destabilizing a particular mode of oscillation.

19. An oscillator according to claim 18, each oscillator circuit having a cross coupling to its Nth serial successor oscillator circuit in the loop.

20. An oscillator according to claim 8, wherein there is an even number of oscillator circuits, N being half said even number, each oscillator circuit comprising a ring oscillator comprising cascaded inverters, the cross coupling comprising an inverting logic gate having an input coupled to a respective said ring oscillator and an output connected to an output of a particular one of the inverters in the Nth successor oscillator circuit.

21. A multiphase oscillator comprising: a plurality of serially coupled oscillator circuits connected together in a loop circuit, each particular oscillator circuit having a coupling to its serial successor oscillator circuit in the loop circuit so that all of the oscillator circuits, at the same time, provide adjustment of frequency and/or phase of an oscillation signal of its successor oscillator circuit dependent upon a difference between the phase of the oscillation signal in the successor oscillator circuit and the phase of an oscillation signal in the particular oscillator circuit, so as to maintain, in operation, the phase difference.

22. The multiphase oscillator as claimed in claim 21 wherein each oscillator circuit comprises a ring oscillator including serially connected inverter circuits, wherein via said couplings each oscillator circuit indirectly influences all of the other oscillator circuits in the loop circuit so that the multiphase oscillator as a whole oscillates in a collective mode of oscillation in which all of the oscillator circuits oscillate at the same frequency but with a phase difference therebetween.

23. The multiphase oscillator as claimed in claim 21 wherein the plurality of oscillator circuits in the loop circuit comprises four oscillator circuits whereby the oscillator circuits oscillate with a 90 degrees phase difference from one another.

24. The multiphase oscillator as claimed in claim 21 wherein all oscillator circuits in the loop circuit are substantially identical to each other and all couplings are substantially identical to each other and the plurality of oscillator circuits in the loop circuit comprises M oscillator circuits whereby successive oscillator circuits oscillate at the same Mth fraction (1/M) of a full period delayed from each other.

25. The multiphase oscillator as claimed in claim 21 wherein each oscillator circuit comprises a ring oscillator including serially connected inverter circuits, said couplings comprise logic gates, and said inverter circuits and said logic gates have a common adjustable voltage supply.

26. The multiphase oscillator as claimed in claim 21 wherein all oscillator circuits in the loop circuit are substantially identical to each other and all couplings are substantially identical to each other such that the loop circuit is symmetrical and successive oscillator circuits oscillate at the same fraction 1/M of a full oscillation period but with a phase delay relative to each other, where M is the number of oscillator circuits in the loop circuit.

27. A multiphase output oscillator comprising:
 a plurality of oscillator sub-circuits serially coupled together in a first loop;
 each of the oscillator sub-circuits comprising an odd number of inverters coupled together to form a respective second loop of serially coupled inverters;
 each particular oscillator sub-circuit having at least a first one of its inverters in common with a respective serial predecessor oscillator sub-circuit of that particular oscillator sub-circuit in the first loop, and having at least a second one of its inverters, different from the first one, in common with a respective serial successor oscillator sub-circuit of that particular oscillator sub-circuit in the first loop.

28. A multiphase output oscillator according to claim 27 wherein each of the oscillator sub-circuits comprises three inverters coupled together to form the respective second loop of serially coupled inverters.

29. A multiphase output oscillator as claimed in claim 27 wherein each second loop of serially coupled inverters includes first and second inverters from a particular oscillator sub-circuit and one inverter from another oscillator sub-circuit in the first loop so that, in operation, each particular oscillator sub-circuit conducts a particular oscillation signal with a respective phase difference maintained between the particular oscillation signals of each particular oscillator sub-circuit and its predecessor oscillator sub-circuit.

30. A multiphase output oscillator comprising:
 a plurality of oscillator sub-circuits serially coupled together in a first loop;
 each of the oscillator sub-circuits comprising a first inverter coupled in a respective series circuit with a second inverter of its oscillator sub-circuit and a first inverter of one adjacent oscillator sub-circuit in the first loop to form a respective second loop including an odd number of serially coupled, inverters, and wherein said first inverter is serially coupled with first and second inverters of a second adjacent oscillator sub-circuit in the first loop to form a further second loop including an odd number of serially coupled inverters.

31. A multiphase output oscillator as claimed in claim 30 wherein each second loop has the same number of inverters.

32. A multiphase output oscillator as claimed in claim 30, wherein each first inverter has its output coupled to an input of the first inverter of the one adjacent oscillator sub-circuit and to an input of the second inverter of the second adjacent oscillator sub-circuit.

\* \* \* \* \*